(12) United States Patent
Ono et al.

(10) Patent No.: US 9,209,760 B2
(45) Date of Patent: Dec. 8, 2015

(54) HIGH-FREQUENCY, BROADBAND AMPLIFIER CIRCUIT

(71) Applicant: Kabushiki Kaisha Toshiba, Minato-ku (JP)

(72) Inventors: Satoshi Ono, Yokohama (JP); Takaya Kitahara, Kamakura (JP); Shigeru Hiura, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 51 days.

(21) Appl. No.: 14/027,510

(22) Filed: Sep. 16, 2013

(65) Prior Publication Data

US 2014/0266443 A1 Sep. 18, 2014

(30) Foreign Application Priority Data

Mar. 14, 2013 (JP) .................................. 2013-051612

(51) Int. Cl.
*H03F 3/45* (2006.01)
*H03F 3/191* (2006.01)
(Continued)

(52) U.S. Cl.
CPC .............. *H03F 3/193* (2013.01); *H03F 1/3205* (2013.01); *H03F 1/56* (2013.01); *H03F 3/19* (2013.01); *H03F 3/26* (2013.01); *H03F 3/45183* (2013.01); *H03F 2200/391* (2013.01); *H03F 2203/21139* (2013.01); *H03F 2203/45481* (2013.01)

(58) Field of Classification Search
CPC ............. H03F 3/45; H03F 1/56; H03F 3/193; H03F 3/26; H03F 3/191
USPC ............ 330/65–68, 117, 251, 255, 264–266, 330/269, 272, 277, 285, 289, 301, 302
See application file for complete search history.

(56) References Cited

U.S. PATENT DOCUMENTS 5,274,341 A * 12/1993 Sekine et al. ................. 330/269
5,477,188 A   12/1995 Chawla et al.
(Continued)

FOREIGN PATENT DOCUMENTS

EP    1 202 446 A2    5/2002
EP    1 605 541 A1   12/2005
(Continued)

OTHER PUBLICATIONS

Worku, Feven Y.,"Bias Circuit for RF Power Amplifiers" Master of Science Thesis in Wireless and Photonics Engineering, Department of Nanotechnology and Nanoscience-MC2, Chalmers University of Technology, Gothenburg, Sweden, 2011.*
(Continued)

*Primary Examiner* — Steven J Mottola
*Assistant Examiner* — Hafizur Rahman
(74) *Attorney, Agent, or Firm* — Oblon, McClelland, Maier & Neustadt, L.L.P.

(57) ABSTRACT

According to one embodiment, a high-frequency, broadband amplifier circuit includes two drive elements, a matching circuit, a Balun circuit, a power supply, and a power supply circuit. The matching circuit includes two pattern circuits. The pattern circuits convey, in differential mode, the high-frequency signals supplied from the two drive elements. The Balun circuit converts the high-frequency signal to a single-end mode signal. The power supply circuit is connected one of the pattern circuits, and supplies at least the output of the power supply to the other pattern circuit.

11 Claims, 2 Drawing Sheets

(51) Int. Cl.
    *H03F 3/193*    (2006.01)
    *H03F 1/56*    (2006.01)
    *H03F 1/32*    (2006.01)
    *H03F 3/19*    (2006.01)
    *H03F 3/26*    (2006.01)

(56) References Cited

U.S. PATENT DOCUMENTS

| | | | |
|---|---|---|---|
| 5,726,603 | A | 3/1998 | Chawla et al. |
| 7,741,907 | B2 * | 6/2010 | Takagi .................. 330/251 |
| 2002/0067211 | A1 | 6/2002 | Matsuyoshi et al. |
| 2004/0178854 | A1 | 9/2004 | Inoue et al. |
| 2006/0132255 | A1 | 6/2006 | Kawanami |

FOREIGN PATENT DOCUMENTS

| | | |
|---|---|---|
| EP | 1605541 A1 * | 12/2005 |
| JP | 5-129854 A | 5/1993 |
| JP | 6-90118 A | 3/1994 |
| JP | 2002-314347 A | 10/2002 |
| JP | 2005-39799 | 2/2005 |
| JP | 2008-85391 A | 4/2008 |
| JP | 2010-11469 A | 1/2010 |

OTHER PUBLICATIONS

Extended European Search Report issued Dec. 6, 2013 in Patent Application No. 13184533.1.
Takenaka, I. et al., "L/S-Band 140-W Push-Pull Power AlGaAs/GaAs HFET's for Digital Cellular Base Stations", IEEE Journal of Solid-State Circuits, vol. 34, No. 9, XP-011061083, Sep. 1, 1999, pp. 1181-1187.
Ono, F. et al., "A 50W Low Distortion GaAs MESFET for Digital Cellular Base Stations", Gallium Arsenide Integrated Circuit (GAASIC) Symposium, XP-032378936, Nov. 3, 1996, pp. 103-106.
Japanese Office Action issued Sep. 29, 2015, in Patent Application No. 2013-051612 with English Translation.

* cited by examiner

HIGH-FREQUENCY, BROADBAND AMPLIFIER CIRCUIT

CROSS-REFERENCE TO RELATED APPLICATIONS

This application is based upon and claims the benefit of priority from Japanese Patent Application No. 2013-051612, filed Mar. 14, 2013, the entire contents of which are incorporated herein by reference.

FIELD

Embodiments described herein relate generally to a high-frequency, broadband amplifier circuit in which two drive elements, for example, perform a push-pull operation, amplifying an outputting a high-frequency signal in the broadband at high efficiency.

BACKGROUND

The terrestrial broadcasting transmitter or the base-station transmitter of a mobile telephone incorporates a high-frequency, broadband amplifier circuit that operate in the UHF band or the microwave band. The high-frequency, broadband amplifier circuit has output FET elements in order to amplify the input power to output power. The larger the output power, the lower the output impedance the EFT elements will have.

The FET elements may be connected to an apparatus other than the broadband transmitter to supply its high-frequency output power to the apparatus. If the EFT elements are so used, its impedance, which is low, must be changed to the impedance of the apparatus, which is, for example, 50Ω. Therefore, the high-frequency, broadband amplifier circuit has a push-pull configuration in many cases, so that the EFT elements may operate in the broadband. In any push-pull circuit, two FET elements are connected to two drain power supplies, respectively.

Among the high-frequency signals used in the terrestrial broadcasting are, for example, orthogonal frequency-division multiplexing (OFDM) signal and code-division multiple access (CDMA) signal used in the mobile-telephone base stations. These signals are modulated in a band ranging from several MHz to tens of MHz.

The FET element has its output power and its drain current greatly changed, depending on the high-frequency modulated signal input to it. The inductance component existing between the drain power supply and the FET element deforms the waveform of the drain current. Therefore, various techniques are used to reduce the inductance component.

DETAILED DESCRIPTION

In general, a high-frequency, broadband amplifier circuit according to one embodiment includes two drive elements, a matching circuit, a Balun circuit, a power supply, and a power supply circuit. The two drive elements perform push-pull operation, amplifying a high-frequency signal and outputting the signal amplified. The matching circuit includes two pattern circuits connected to the outputs of the two drive elements, respectively. The pattern circuits convey, in differential mode, the high-frequency signals supplied from the two drive elements. The Balun circuit converts the high-frequency signal output from the matching circuit to a single-end mode signal. The power supply circuit is connected one of the pattern circuits. The power supply circuit connects the two pattern circuits, and supplies at least the output of the power supply to the other pattern circuit.

First Embodiment

The first embodiment will be described with reference to FIG. 1.

Figure 1:
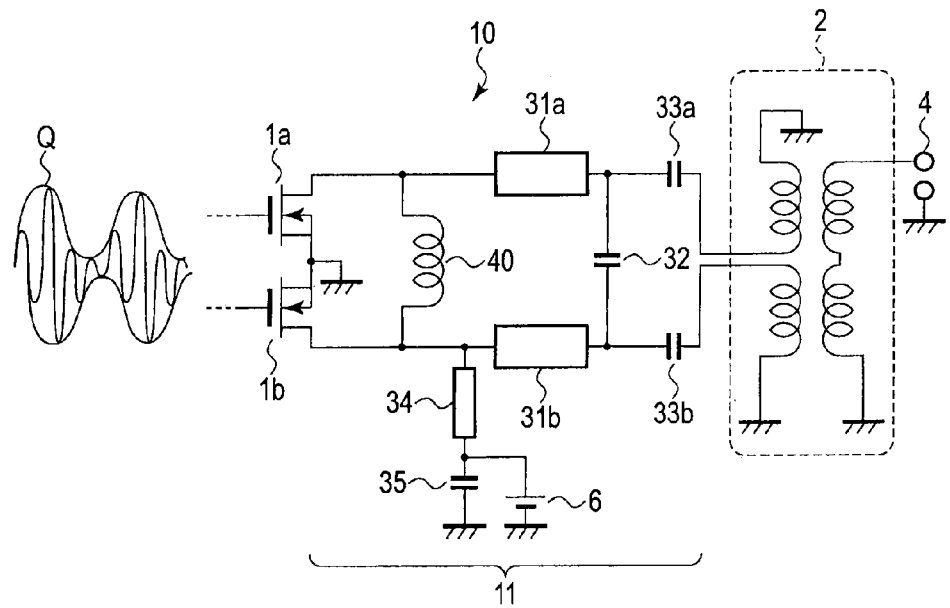
FIG. 1 is a circuit diagram showing a high-frequency, broadband amplifier circuit according to the first embodiment.

FIG. 1 is a circuit diagram of a high-frequency, broadband amplifier circuit 10 according to the first embodiment. The high-frequency, broadband amplifier circuit 10 includes two FET elements (hereinafter called "output FET elements") 1a and 1b used as two drive elements. The output FET elements 1a and 1b operate as high-frequency (RF) power amplifiers in the UHF band or the microwave band. The output FET elements 1a and 1b perform push-pull operation, each amplifying the input signal and outputting a high-frequency signal Q. The high-frequency, broadband amplifier circuit 10 is formed on a circuit board. The two output FET elements 1a and 1b constitute a push-pull circuit, which outputs an amplified high-frequency signal Q.

The drain terminals of the output FET elements 1a and 1b are connected, respectively to the output-side matching-circuit patterns 31a and 31b of a matching circuit 11. The output-side matching-circuit patterns 31a and 31b match the impedance with the impedance of the Balun circuit 2 connected to the output of the matching circuit 11. The output-side matching-circuit patterns 31a and 31b have a specific form each and are formed in parallel to each other. The output-side matching-circuit patterns 31a and 31b are formed on the circuit board and made of, for example, copper. The output-side matching-circuit patterns 31a and 31b supply, in differential mode, the high-frequency signal Q supplied from the two output FET elements 1a and 1b.

The output-side matching-circuit patterns 31a and 31b are connected to the Balun circuit 2, respectively by output-side DC cutting capacitors 33a and 33b. The output-side DC cutting capacitors 33a and 33b cut the DC components from the high-frequency signal Q, respectively. A capacitor 32 is connected between the output-side matching-circuit patterns 31a and 31b. The capacitor 32 is a capacitor component generated between the output-side matching-circuit patterns 31a and 31b.

The Balun circuit 2 matches the matching circuit 11 with a coaxial cable having impedance of 50Ω and connected to the RF output terminal 4 of the high-frequency, broadband amplifier circuit 10. The Balun circuit 2 receives the high-frequency signal Q of the differential mode for push-pull operation, output from the matching circuit 11, and coverts the high-frequency signal Q to a high-frequency signal of single-end mode. The signal of single-end mode is output from the RF output terminal 4. The Balun circuit 2 is grounded at the side of the output FET elements 1a and 1b.

One of the two output-side matching-circuit patterns 31a and 31b, e.g., output-side matching-circuit pattern 31b, is connected to a serial circuit composed of a quarter-wave circuit pattern element (hereinafter called "circuit pattern element") 34 and an output bias capacitance 35. A bias power supply 6 is connected to the node of the circuit pattern element 34 and the output bias capacitance 35. The circuit pattern element 34 has a prescribed pattern and is formed on the circuit board. The output bias capacitance 35 cuts the bias voltage of the bias power supply 6, which would otherwise influence the high-frequency, broadband amplifier circuit 10. The output bias capacitance 35 is connected between the output-side matching-circuit pattern 31a and the Balun circuit 2, because the output FET elements 1a and 1b of the Balun circuit 2 are grounded.

Between the output-side matching-circuit patterns 31a and 31b, an inductance element 40 is connected as power supply circuit. The inductance element 40 applies the bias voltage output from the bias power supply 6 to the drains of the two output FET elements 1a and 1b, respectively through the two output-side matching-circuit patterns 31a and 31b. The inductance element 40 may be any element having inductance, such as a coil element or a wire.

The inductance component of the inductance element 40 has an impedance ZL. The impedance ZL is 20 or more times the impedance $Z_{FET}$ of the two output FET elements 1a and 1b, and is set in accordance with the following formulae (1) and (2), to a value equal to or less than 1 ohm (1Ω) at the modulation frequency $f_{MOD}$ of the high-frequency signal Q:

$$2\pi \cdot f_{RF} \cdot L \geq 20 \cdot Z_{FET} \quad (1)$$

$$2\pi \cdot f_{MOD} \cdot L \leq 1 \quad (2)$$

In the high-frequency, broadband amplifier circuit 10 so configure as described above, the bias voltage output from the bias power supply 6 is applied via the circuit pattern element 34 to the drain terminal of the output FET element 1b, and is applied from the circuit pattern element 34 via the inductance element 40 to the drain terminal of the output FET element 1a.

When the output FET elements 1a and 1b receives the high-frequency signal Q at gate, they output two high-frequency signals Q, respectively. The high-frequency signals Q are supplied the output-side matching-circuit patterns 31a and 31b, respectively.

The output-side matching-circuit patterns 31a and 31b supply the high-frequency signals Q coming from the output-side matching-circuit patterns 31a and 31b, to the Balun circuit 2 in differential mode.

The Balun circuit 2 converts the high-frequency signal Q output from the matching circuit 11, in the differential mode of push-pull operation, to a high-frequency signal of the single-end mode. The high-frequency signal of the single-end mode is output from the RF output terminal 4.

In the high-frequency, broadband amplifier circuit 10 described above, the inductance element 40 is connected between the output-side matching-circuit patterns 31a and 31b, and the bias voltage output from the bias power supply 6 is applied to the drain terminals of the output FET elements 1a and 1b through the two output-side matching-circuit patterns 31a and 31b. Thus, one bias voltage can be applied from the bias power supply 6 to two output FET elements 1a and 1b. Since the high-frequency, broadband amplifier circuit 10 needs to have, but one bias power supply 6, it can not only be simplified in circuit configuration, but also be made small.

The impedance ZL of the inductance component of the inductance element 40 is 20 or more times the impedance $Z_{FET}$ of the two output FET elements 1a and 1b and is set to a value equal to or less than 1 ohm (1Ω) at the modulation frequency $f_{MOD}$ of the high-frequency signal Q, as shown in the formulae (1) and (2) set forth above. Therefore, the inductance element 40 imposes no influence on the high-frequency, broadband amplifier circuit 10. Nor does the inductance element 40 imposes any influence on the changes in the drain currents of the two output FET elements 1a and 1b because its impedance ZL is very low, or equal to or less than 1 ohm (1Ω) with respect to the high-frequency signal Q.

Second Embodiment

The second embodiment will be described with reference to FIG. 2. The components identical to those shown in FIG. 1 are designated by the same reference numbers in FIG. 2, and will not described in detail.

Figure 2:
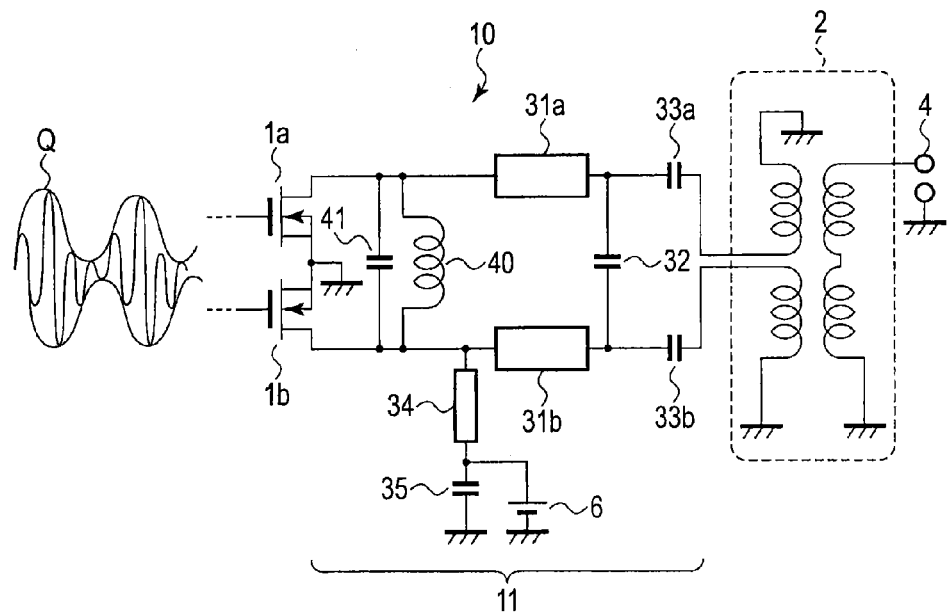
FIG. 2 is a circuit diagram showing a high-frequency, broadband amplifier circuit according to the second embodiment.

FIG. 2 is a circuit diagram of a high-frequency, broadband amplifier circuit 10 according to the second embodiment. In this high-frequency, broadband amplifier circuit 10, a capacitance element 41 for output-side inductance resonance (hereinafter called "capacitance element") is connected in parallel to the inductance element 40.

The capacitance element 41 includes a capacitance component C that cancels out the impedance ZL of the inductance component L of the inductance element 40. The capacitance element 41 has such capacitance that it may resonate with the inductance element 40 in the frequency band of the high-frequency signal Q, in which the both output FET elements 1a and 1b operate. The capacitor component C of the capacitance element 41 is set in accordance with the following formulae (3) and (4):

$$2\pi \cdot f_{RF} \cdot L = 1/2\pi \cdot f_{RF} \cdot C \quad (3)$$

$$2\pi \cdot f_{MOD} \cdot L \leq 1 \quad (4)$$

In the second embodiment, the capacitance element 41 having the capacitance component C cancelling out the impedance ZL of the inductance component L of the inductance element 40 in the RF frequency band $f_{RF}$ is thus connected in parallel to the inductance element 40. The second embodiment can therefore achieve the same advantage as the first embodiment. Further, the second embodiment can set the inductance L of the inductance element 40 irrespective of the RF frequency band $f_{RF}$, and can greatly reduce the impedance ZL of the inductance element 40 at a frequency lower than the modulation frequency $f_{MOD}$ of the high-frequency signal Q. The capacitance element 41 may be any capacitance existing in the two output FET elements 1a and 1b.

Third Embodiment

The third embodiment will be described with reference to FIG. 3. The components identical to those shown in FIG. 1 are designated in FIG. 3 by the same reference numbers, and will not described in detail.

Figure 3:
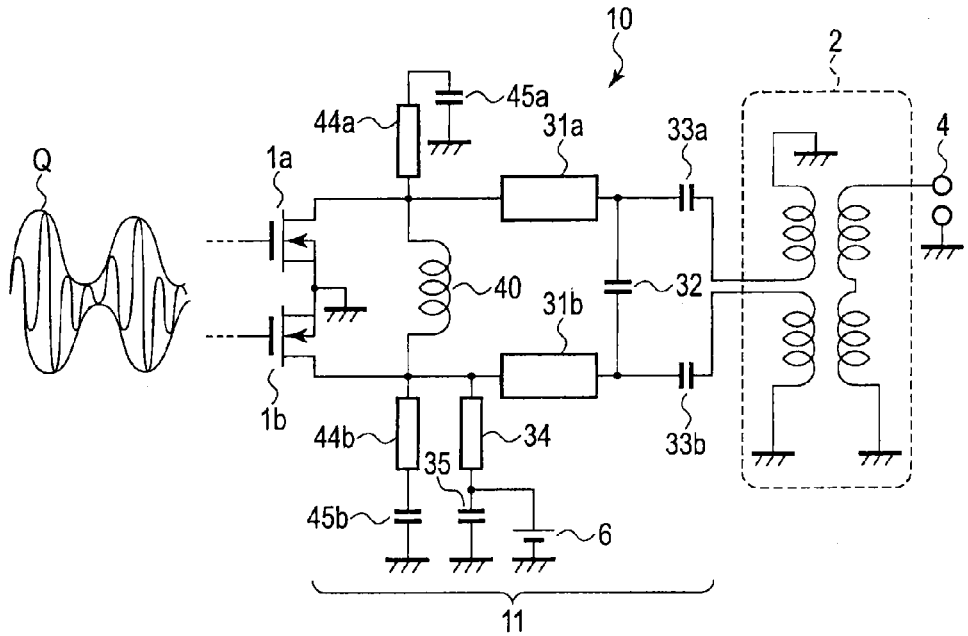
FIG. 3 is a circuit diagram showing a high-frequency, broadband amplifier circuit according to the third embodiment.

FIG. 3 is a circuit diagram of a high-frequency, broadband amplifier circuit 10 according to the third embodiment. In this high-frequency, broadband amplifier circuit 10, a series circuit composed of an output-side inductance circuit pattern 44a and an output-side inductance capacitance element 45a is connected to the connection node of the inductance element 40 and the output-side matching pattern circuit 31a, and is grounded.

In the high-frequency, broadband amplifier circuit 10, a series circuit composed of the output-side inductance circuit pattern 44b and the output-side inductance capacitor element 45b is connected to the connection node of the inductance element 40 and the other output-side matching pattern circuit 31b and is grounded. The output-side inductance circuit patterns 44a and 44b are formed on the circuit board, each in a prescribed pattern form, and can be adjusted in terms of, for example, pattern length.

In the third embodiment, two series circuits, one composed of the output-side inductance circuit pattern 44a (adjustable in length) and the output-side inductance capacitance element 45a, and the other composed of the output-side inductance circuit pattern 44b (adjustable in length) and the output-side inductance capacitance element 45b, are connected, respectively to the connection node of the inductance element 40 and the output-side matching pattern circuit 31a and the connection node of the inductance element 40 and the output-side matching pattern circuit 31b. The third embodiment can therefore achieve the same advantage as the first embodiment. In addition, the overall inductance can be minutely changed by adjusting both output-side inductance circuit patterns 44a and 44b in terms of length. As a result, the output FET elements 1a and 1b, on the one hand, and the Balun circuit 2, on the other, can be matched in terms of impedance.

The inductance circuit composed of the two output-side matching pattern circuits 31a and 31b and the output-side inductance capacitance elements 45a and 45b is connected between the matching circuit 11 and the ground. The connecting point of the inductance circuit and the point where the drain voltage is applied from the bias power supply 6 are spaced at the same distance, respectively from the drain terminals of the two output FET elements 1a and 1b.

MODIFICATION

A modification of the third embodiment will be described with reference to FIG. 4. The components identical to those shown in FIG. 3 are designated in FIG. 4 by the same reference numbers, and will not described in detail.

Figure 4:
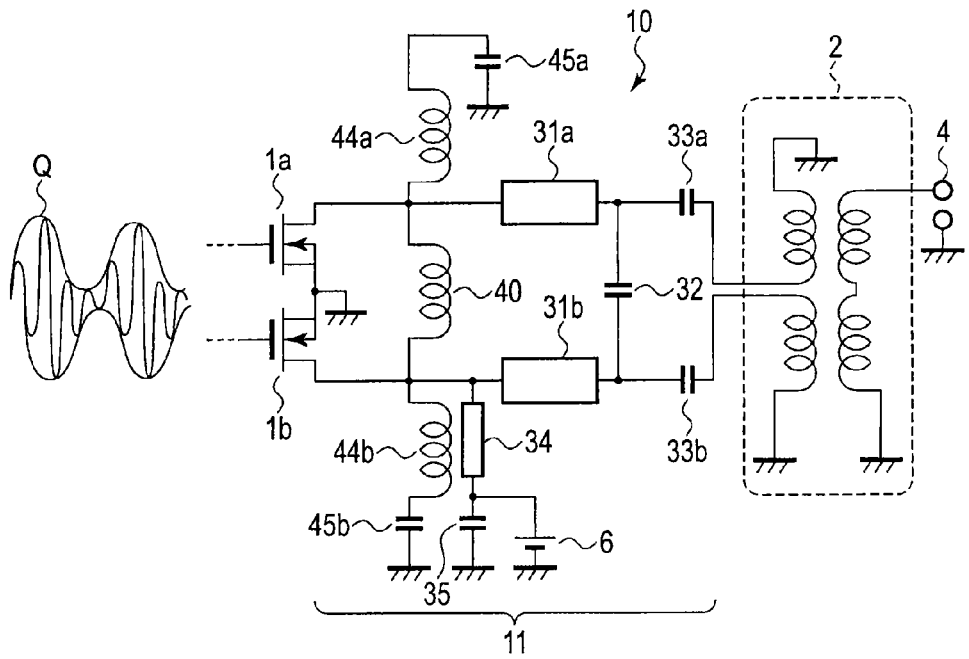
FIG. 4 is a circuit diagram showing a high-frequency, broadband amplifier circuit according to a modification of the high-frequency, broadband amplifier circuit according to the third embodiment.

FIG. 4 is a circuit diagram of a modified high-frequency, broadband amplifier circuit 10. The modified broadband amplifier circuit 10 has inductance circuit patterns 44a and 44b, which are used in place of output-side inductance circuit patterns 44a and 44b. The inductance circuit patterns 44a and 44b have an inductance component each, such as a coil element or a wire. The inductance circuit patterns 44a and 44b can be adjusted in length.

So configured, the modified broadband amplifier circuit 10 can achieve the same advantage as the first embodiment described above. In addition, the inductance circuit patterns 44a and 44b, which are coil elements or wires, may be adjusted in length, minutely changing the overall inductance and thereby matching the output FET elements 1a and 1b with the Balun circuit 2 in terms of impedance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A high-frequency, broadband amplifier circuit comprising:
two drive elements configured to perform push-pull operation, thereby to amplify a high-frequency signal and outputting the signal amplified;
a matching circuit including two pattern circuits connected to the outputs of the two drive elements, respectively, the pattern circuits configured to convey, in differential mode, the high-frequency signals supplied from the two drive elements;
a Balun circuit configured to convert the high-frequency signals output from the matching circuit to a single-end mode signal;
a power supply connected one of the pattern circuits; and
a power supply circuit connecting the two pattern circuits and configured to supply at least the output of the power supply to the other pattern circuit;
wherein the power supply includes an inductance component; and
the inductance component has impedance 20 or more times the impedance of the two drive elements and is set to a value equal to or less than 1 ohm at a frequency equal to or lower than the modulation frequency of the high-frequency signal.

2. The high-frequency, broadband amplifier circuit according to claim 1,
wherein the impedance of the inductance component is set in accordance with the following formulae:

$$2\pi \cdot f_{RF} \cdot L \geq 20 \cdot Z_{FET}$$

$$2\pi \cdot f_{MOD} \cdot L \leq 1,$$

where L is the inductance component, $f_{RF}$ is the frequency band of the high-frequency signal, $f_{MOD}$ is the modulation frequency of the high-frequency signal, and $Z_{FET}$ is the impedance of two output FET elements used as the two drive elements.

3. The high-frequency, broadband amplifier circuit according to claim 1,
wherein the power supply circuit includes a capacitor component that cancels the impedance of the inductance component.

4. The high-frequency, broadband amplifier circuit according to claim 3,
wherein a capacitance element including the capacitor component has such capacitance as to resonate with an inductance element including the inductance component, in the frequency band of the high-frequency signal.

5. A high-frequency, broadband amplifier circuit comprising:
two drive elements configured to perform push-pull operation, thereby to amplify a high-frequency signal and outputting the signal amplified;
a matching circuit including two pattern circuits connected to the outputs of the two drive elements, respectively, the pattern circuits configured to convey, in differential mode, the high-frequency signals supplied from the two drive elements;
a Balun circuit configured to convert the high-frequency signals output from the matching circuit to a single-end mode signal;
a power supply connected one of the pattern circuits; and
a power supply circuit connecting the two pattern circuits and configured to supply at least the output of the power supply to the other pattern circuit;
wherein the power supply circuit includes an inductance component and a capacitor component that cancels the impedance of the inductance component; and a capacitance C of the capacitor component is set so as to satisfy the following formulae in such a manner that a capacitance element including the capacitor component resonates with an inductance element including the inductance component in the frequency band of the high-frequency signal:

$2\pi \cdot f_{RF} \cdot L = 1/2\pi \cdot f_{RF} \cdot C$ $2\pi \cdot f_{MOD} \cdot L \leq 1$ wherein L is an inductance of the inductance component, $f_{RF}$ is the frequency band of the high-frequency signal, and $f_{MOD}$ is the modulation frequency of the high-frequency signal.

6. The high-frequency, broadband amplifier circuit according to claim 4,
wherein a capacitance C of the capacitor component is set so as to satisfy the following formulae:

$2\pi \cdot f_{RF} \cdot L = 1/2\pi \cdot f_{RF} \cdot C$ $2\pi \cdot f_{MOD} \cdot L \leq 1$ wherein L is an inductance of the inductance component, $f_{RF}$ is the frequency band of the high-frequency signal, and $f_{MOD}$ is the modulation frequency of the high-frequency signal.

7. The high-frequency, broadband amplifier circuit according to claim 1,
wherein the power supply circuit includes an impedance matching circuit configured to adjust an overall impedance of the power supply circuit.

8. The high-frequency, broadband amplifier circuit according to claim 5,
wherein the power supply circuit includes an impedance matching circuit configured to adjust an overall impedance of the power supply circuit.

9. A high-frequency, broadband amplifier circuit comprising:
two drive elements configured to perform push-pull operation, thereby to amplify a high-frequency signal and outputting the signal amplified;
a matching circuit including two pattern circuits connected to the outputs of the two drive elements, respectively, the pattern circuits configured to convey, in differential mode, the high-frequency signals supplied from the two drive elements;
a Balun circuit configured to convert the high-frequency signals output from the matching circuit to a single-end mode signal;
a power supply connected one of the pattern circuits; and
a power supply circuit connecting the two pattern circuits and configured to supply at least the output of the power supply to the other pattern circuit;
wherein the power supply circuit includes an inductance element including an inductance component and an impedance matching circuit which comprises a series circuit composed of an inductance circuit and a capacitance element and connected to a connection node of the matching circuit and the inductance element including the inductance component; and
the inductance circuit is adjustable in pattern length.

10. The high-frequency, broadband amplifier circuit according to claim 1,
wherein the power supply circuit includes a coil element or a wire, which has an inductance component.

11. The high-frequency, broadband amplifier circuit according to claim 9,
wherein the inductance circuit includes a coil element or a wire, which has an inductance component.

\* \* \* \* \*